United States Patent
Yang et al.

(10) Patent No.: US 7,698,811 B2
(45) Date of Patent: Apr. 20, 2010

(54) METHOD FOR MANUFACTURING MULTILAYER PRINTED CIRCUIT BOARDS USING INNER SUBSTRATE

(75) Inventors: Chih-Kang Yang, Taoyuan (TW); Cheng-Hsien Lin, Taoyuan (TW)

(73) Assignee: Foxconn Advanced Technology Inc., Tayuan, Taoyuan (TW)

( * ) Notice: Subject to any disclaimer, the term of this patent is extended or adjusted under 35 U.S.C. 154(b) by 35 days.

(21) Appl. No.: 11/959,212

(22) Filed: Dec. 18, 2007

(65) Prior Publication Data
US 2009/0013526 A1 Jan. 15, 2009

(30) Foreign Application Priority Data
Jul. 13, 2007 (CN) .................. 2007 1 0076017

(51) Int. Cl.
H05K 3/00 (2006.01)
H05K 3/36 (2006.01)
H05K 3/30 (2006.01)
H01K 3/10 (2006.01)

(52) U.S. Cl. .............. 29/829; 29/830; 29/832; 29/852

(58) Field of Classification Search .......... 29/829, 29/830, 832, 852
See application file for complete search history.

(56) References Cited

U.S. PATENT DOCUMENTS

| | | | | |
|---|---|---|---|---|
| 2,703,853 A | * | 3/1955 | Chrystie | 361/815 |
| 3,242,384 A | * | 3/1966 | Klehm, Jr. | 361/736 |
| 4,742,183 A | * | 5/1988 | Soloway et al. | 174/254 |
| 5,406,027 A | * | 4/1995 | Matsumoto et al. | 174/546 |
| 6,483,713 B2 | * | 11/2002 | Samant et al. | 361/749 |
| 2002/0075660 A1 | * | 6/2002 | Samant et al. | 361/752 |
| 2005/0129917 A1 | * | 6/2005 | Ragland et al. | 428/209 |
| 2005/0130389 A1 | * | 6/2005 | Yamazaki et al. | 438/455 |
| 2005/0206524 A1 | * | 9/2005 | Forster et al. | 340/572.8 |
| 2005/0236182 A1 | * | 10/2005 | Hayashi et al. | 174/262 |
| 2005/0284657 A1 | * | 12/2005 | Ryu et al. | 174/262 |
| 2008/0005896 A1 | * | 1/2008 | Yeh et al. | 29/829 |

* cited by examiner

*Primary Examiner*—A. Dexter Tugbang
*Assistant Examiner*—David P Angwin
(74) *Attorney, Agent, or Firm*—Clifford O. Chi

(57) ABSTRACT

An exemplary inner substrate for manufacturing multilayer printed circuit boards is provided. The inner substrate has a number of substrate units and a number of transverse folding portions alternately arranged along a longitudinal direction of the inner substrate. Each of the substrate units is configured for forming a unitary printed circuit board. Each of the folding portions is interconnected between neighboring substrate units. Each of the folding portions defines at least one line weakness perpendicular to the longitudinal direction of the inner substrate for facilitating folding and unfolding the neighboring substrate units to each other. An exemplary method for manufacturing multilayer printed circuit boards using the inner substrate is also provided. The method can improve efficiency of manufacturing multilayer printed circuit boards.

18 Claims, 10 Drawing Sheets

METHOD FOR MANUFACTURING MULTILAYER PRINTED CIRCUIT BOARDS USING INNER SUBSTRATE

BACKGROUND

1. Technical Field

The present invention relates to printed circuit boards, and more particularly relates to an inner substrate for manufacturing multilayer printed circuit boards and a method for manufacturing multilayer printed circuit boards using the inner substrate.

2. Description of Related Art

In order to accommodate development of miniaturization and multifunction of electronic products, multilayer printed circuit boards are widely used due to their characteristics such as micromation, light quality, high-density interconnection.

Multilayer printed circuit boards usually includes multilayer rigid printed circuit boards and multilayer flexible printed circuit boards. Nowadays, multilayer printed circuit boards are manufactured using a typical sheet-by-sheet process. However, only one multilayer printed circuit board can be manufactured at a time, using the typical method describe above. Thus, efficiency of manufacturing multilayer printed circuit boards is low and cost of manufacturing multilayer printed circuit boards is high.

Currently, flexible printed boards can be manufactured using a roll-to-roll process that is a substitute of a typical sheet-by-sheet process. The roll-to-roll process can enhance efficiency of manufacturing flexible printed boards. However, a multilayer flexible printed circuit board is generally thicker than a single layer flexible printed circuit board, flexibility of the multilayer flexible printed circuit board is low. Thus, it is difficult for the multilayer flexible printed circuit board to be wrapped around a roller. Therefore, the roll-to-roll process for manufacturing the single flexible printed circuit board is not suitable for manufacturing the multilayer flexible printed circuit board. Therefore, multilayer flexible printed circuit boards are still manufactured using the sheet-by-sheet process like typical multilayer rigid printed circuit boards. Thus, efficiency of manufacturing multilayer flexible printed circuit boards is also low and cost of manufacturing multilayer flexible printed circuit boards is also high.

What is needed, therefore, is an inner substrate for manufacturing multilayer printed circuit boards and a method for manufacturing multilayer printed circuit boards using the inner substrate, thereby improving efficiency of manufacturing multilayer printed circuit boards.

SUMMARY

One present embodiment provides an inner substrate for manufacturing multilayer printed circuit boards. The inner substrate has a number of substrate units and a number of transverse folding portions alternately arranged along a longitudinal direction of the inner substrate. Each of the substrate units is configured for forming a unitary printed circuit board. Each of the folding portions is interconnected between neighboring substrate units. Each of the folding portions defines at least one lineweakness perpendicular to the longitudinal direction of the inner substrate for facilitating folding and unfolding the neighboring substrate units to each other.

Another present embodiment provides a method for multilayer printed circuit boards. In the method, firstly, an elongated inner substrate having a number of substrate units and a number of transverse folding portions alternately arranged along a longitudinal direction of the inner substrate is formed. Each of the substrate units is configured for forming a unitary printed circuit board. Each of the folding portions is interconnected between neighboring substrate units. Each of the folding portions defines at least one lineweakness perpendicular to the longitudinal direction of the inner substrate. Secondly, at least one circuit substrate is laminated on each of the substrate units. Thirdly, the inner substrate is folded in a manner such that at least two of the substrate units are stacked one on another. Fourthly, the stacked substrate units are unfolded. Fifthly, the at least one circuit substrate on each of the unfolded substrate units is processed.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

Embodiments will now be described in detail below and with reference to the drawings.

Figure 1:
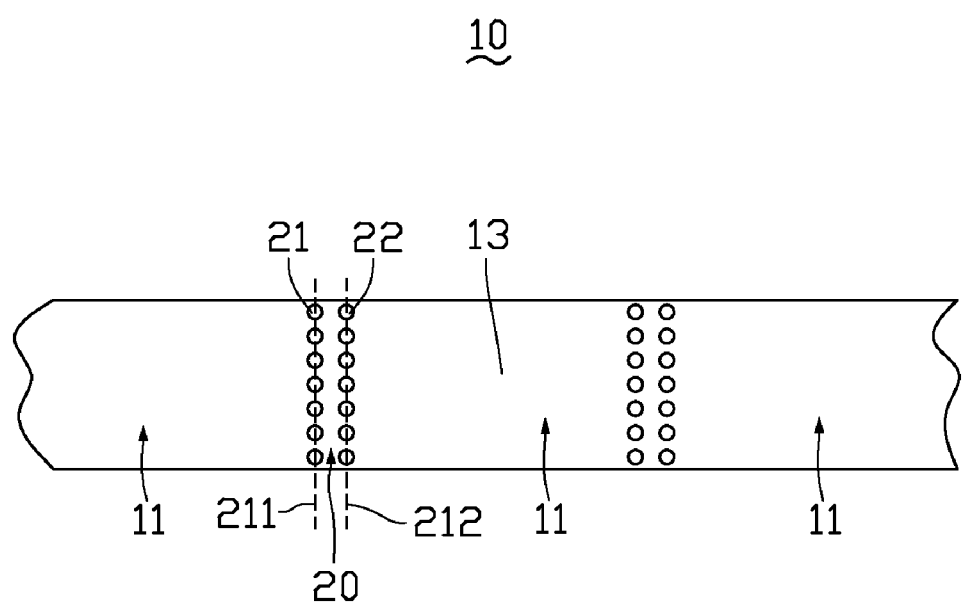
FIG. 1 is a schematic view of an inner substrate according to a present embodiment.
Figure 2:
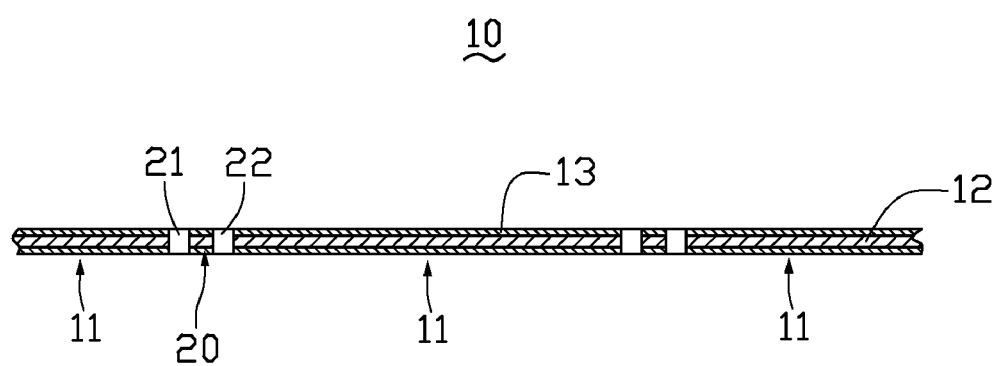
FIG. 2 is a schematic, cross-sectional view of the inner substrate in FIG. 1.

Referring to FIG. 1 and FIG. 2, an exemplary inner substrate 10 for manufacturing multilayer printed circuit boards is shown. The inner substrate 10 is elongated tape-shaped. The inner substrate 10 can be a rigid printed circuit substrate or a flexible printed circuit substrate. The inner substrate 10 can be a single-layer structure or a multilayer structure containing two layers, four layers, six layers or more. In the present embodiment, referring to FIG. 2, the inner substrate 10 is a double-sided structure. The inner substrate 10 includes an insulating base film and two electrically conductive layers formed on two opposite sides of the insulating base film. The inner substrate 10 has a number of substrate units 11 and a number of transverse folding portions 20 alternately arranged along a longitudinal direction thereof.

In detail, the substrate units 11 are arranged along a longitudinal direction of the inner substrate 10. Each of the substrate units 11 includes an insulating layer 12 (i.e., the insulating base film of the inner substrate 10) and two conductive circuit layers 13 (i.e., the corresponding electrically conductive layer of the inner substrate 10). The conductive circuit layers 13 are configured for forming conductive circuit patterns on two opposite sides of the insulating layer 12, respectively. Each of the substrate units 11 can be configured for forming a unitary printed circuit board. Each of the folding portions 20 interconnects the two neighboring substrate units 11. Thus, the folding portions 20 are also arranged along a longitudinal direction of the inner substrate 10. Therefore, it is noted that the inner substrate 10 is divided into a number of the substrate units 11 by the folding portions 20.

Each of the folding portions 20 defines two line weaknesses including a first line 211 and a second line 212 both perpendicular to the longitudinal direction of the inner substrate 10, for facilitating folding and unfolding the neighboring substrate units 11 with/from each other. The first line 211 is parallel to the second line 212. Each of the folding portions 20 defines a number of first through-holes 21 aligned in the first line 211 and a number of second through-holes 22 aligned in the second line 212. A distance between the first line 211 and the second line 212 is determined by a thickness of the corresponding multilayer printed circuit board finally produced. Generally, the distance between the first line 211 and the second line 212 is either equal to or larger than a total thickness of two neighboring stacked substrate units 11 of the inner substrate 10 and two circuit substrates sandwiched between the stacked substrate units 11 once the inner substrate 10 has been folded. (That is, at least one circuit substrate is laminated onto each of the two neighboring substrate units 11, on an identical side of the inner substrate 10, and then later on the two adjacent circuit substrates on the identical side of the inner substrate 10 become sandwiched between the two neighboring substrate units 11 during folding of the inner substrate 10. For more details, please refer to the description provided below in relation to FIG 7.

Additionally, in general, the thicknesses of the two circuit substrates sandwiched between any two neighboring stacked substrate units 11 may be the same or may be different. Accordingly, the distance between the first line 211 and the second line 212 of each folding portion 20 can be identical with that of the other folding portions 20 or different from that of any or all of the other folding portions 20. Because the weakness of the inner substrate 10 at the first through-holes 21 and the second through-holes 22, the flexibility of inner substrate 10 is increased, especially/particularly at the area of the first through-holes 21 and the second through-holes 22. Thus, the inner substrate 10 can be folded or unfolded at the first through-holes 21 along the first line 211 and the second through-holes 22 along the second line 212.

It is noted that the folding portions 20 can be in other structures.

Figure 3:
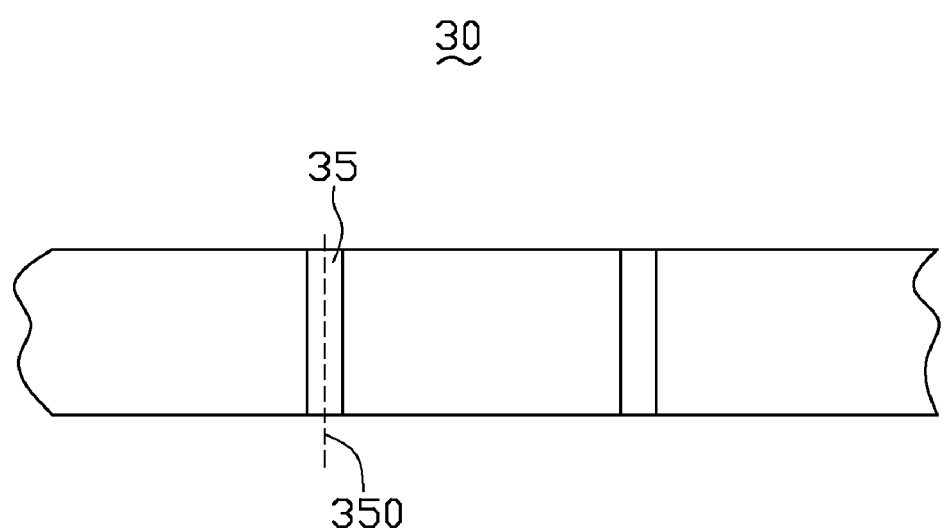
FIG. 3 is a schematic view of another inner substrate according to the present embodiment.
Figure 4:
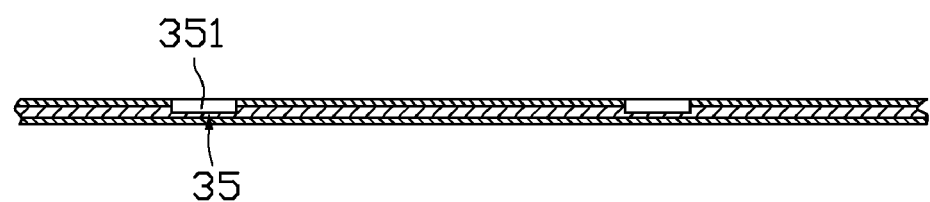
FIG. 4 is a schematic, cross-sectional view of the inner substrate in FIG. 3.

Referring to FIGS. 3 and 4, another exemplary inner substrate 30 for manufacturing multilayer printed circuit boards is shown. The inner substrate 30 is similar to the inner substrate 10 except for folding portions 35. Each of the folding portions 35 defines a line weakness including a third line 350 for facilitating folding and unfolding the neighboring substrate units 11 with/from each other. The third line 350 extends perpendicularly to a longitudinal direction of the inner substrate 30. Each of the folding portions 35 defines a groove 351 on one side thereof along the third line 350. A width of the groove 351 is determined by a thickness of the corresponding multilayer printed circuit board finally produced. Generally, the width of the groove 351 is either equal to or larger than a total thickness of two neighboring stacked substrate units 31 of the inner substrate 30 and two circuit substrates sandwiched between the stacked substrate units 31 once the inner substrate 30 has been folded. (That is at least one circuit substrate is laminated onto each of the two neighboring substrate units 31, on an identical side of the inner substrate 30, and then later on the two adjacent circuit substrates on the identical side of the inner substrate 30 become sandwiched between the neighboring substrate units 31 during folding of the inner substrate 30. It is noted that each of the folding portions 35 can define a groove 351 at each of the two opposite sides of the inner substrate 30.

Figure 5:
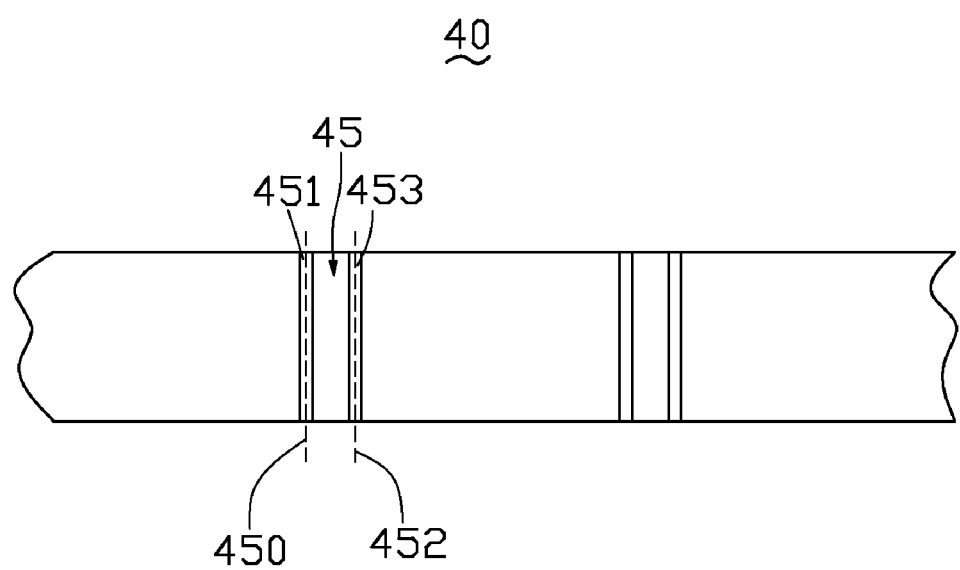
FIG. 5 is a schematic view of further another inner substrate according to the present embodiment.
Figure 6:
FIG. 6 is a schematic, cross-sectional view of the inner substrate in FIG. 5.

Referring to FIGS. 5 and 6, further another exemplary inner substrate 40 for manufacturing multilayer printed circuit boards is shown. The inner substrate 40 is similar to the inner substrate 10 except the folding portions 45. Each of the folding portions 35 defines a first groove 451 along a first line 450 and a second groove 453 along a second line 452. It is noted that each of the folding portions 45 can define a first groove 451 along the first line 450 respectively on two opposite sides of the inner substrate 40 and a second groove 453 along the second line 452 respectively on two opposite sides of the inner substrate 40.

Multilayer printed circuit boards can be manufactured using the inner substrate 10, 20, or 30, as described above. In the present embodiment, the method for manufacturing multilayer printed circuit boards using the inner substrate 10 includes the following steps.

Step 1: the inner substrate 10, as described above, is formed.

In the present embodiment, the inner substrate 10 is a single-layer double-sided structure, therefore, the inner substrate 10 can be formed with a double-sided copper-clad substrate. A large sheet of raw double-sided copper-clad substrate is divided into a number of elongated tape-shaped double-sided copper-clad substrate according to sizes of multilayer printed circuit boards. The elongated tape-shaped double-sided copper-clad substrate can be wrapped around a roller and be configured for forming the inner substrate 10. The conductive circuit layer 13 on the two opposite sides of the inner substrate 10 can be formed with two copper foils of the double-sided copper-clad substrate using a photolithographic process or a laser ablation process.

The folding portions 20 can be formed before or after the conductive circuit layers 13 are formed. The folding portions 20 can be formed using a laser drilling process, a mechanical drilling process or a chemical etching process.

Step 2: at least one circuit substrate is laminated on each of the substrate units 11 of the inner substrate 10.

For the purpose of illustration only, in the present embodiment, each of the substrate units 11 of the inner substrate 10 has two circuit substrates laminated on two opposite sides thereof, respectively. It is noted that in alternative embodiments, each of the substrate units 11 of the inner substrate 10 can have only one circuit substrate laminated on only one side thereof. The circuit substrates laminated can be rigid printed circuit substrates or flexible printed circuit substrates. The circuit substrates can be single-layer structures, or multilayer structures containing two layers, four layers, six layers or more. In the present embodiment, each of the circuit substrates is a single-sided structure that including an insulating layer and an electrically conductive layer. During laminating the circuit substrates, the insulating layer of each of the circuit substrates is in contact with the corresponding conductive circuit layer 13 of the corresponding substrate unit 11. Thereby, the circuit substrates are laminated onto the two opposite sides of the substrate unit 11.

Figure 7:
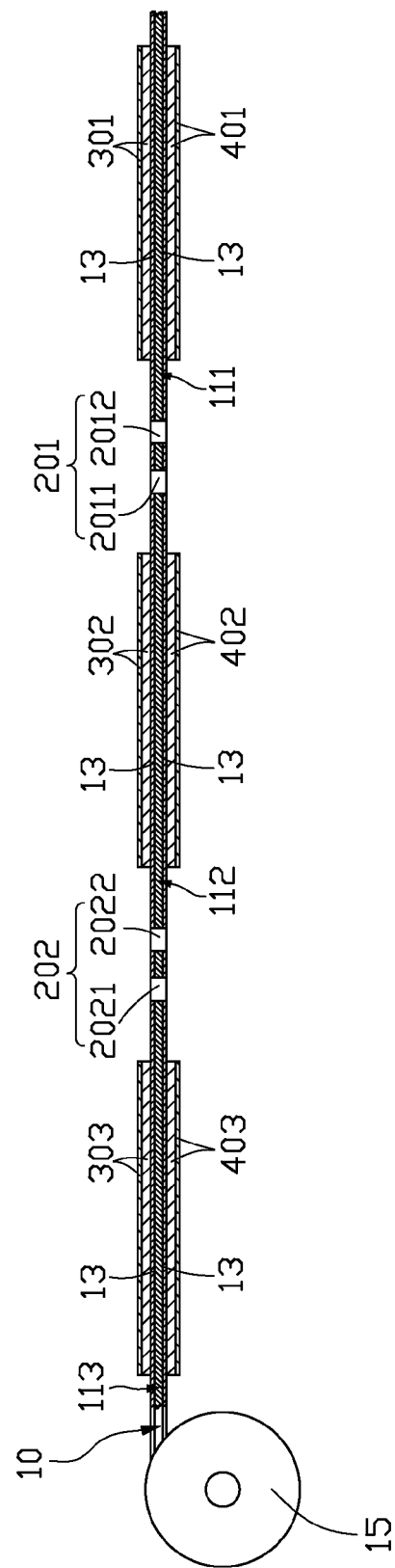
FIG. 7 is a schematic, cross-sectional view of an inner substrate having circuit substrates laminated thereon according to the present embodiment.

In detail, referring to FIG 7. the inner substrate 10 can be provided using a roller 15. The inner substrate 10 includes a first substrate unit 111, a second substrate unit 112, a third substrate unit 113, a first folding portion 201 and a second folding portion 202. The first folding portion 201 interconnects the first substrate unit 111 and the second substrate unit 112. The second folding portion 202 interconnects the second substrate unit 112 and the third substrate unit 113. During laminating, a first circuit substrate 301 and a second circuit substrate 401 are laminated onto two opposite sides of the first substrate unit 111, respectively. A third circuit substrate 302 and a fourth circuit substrate 402 are laminated onto two opposite sides of the second substrate unit 112, respectively. A fifth circuit substrate 303 and a sixth circuit substrate 403 are laminated onto two opposite sides of the third substrate unit 113, respectively.

In the present embodiment, the first circuit substrate 301, the second circuit substrate 401, the third circuit substrate 302, the fourth circuit substrate 402, the fifth circuit substrate 303 and the sixth circuit substrate 403 have an identical thickness. It is noted that the first circuit substrate 301, the second circuit substrate 401, the third circuit substrate 302, the fourth circuit substrate 402, the fifth circuit substrate 303 and the sixth circuit substrate 403 can have different thicknesses. Each of the first circuit substrate 301, the second circuit substrate 401, the third circuit substrate 302, the fourth circuit substrate 402, the fifth circuit substrate 303 and the sixth circuit substrate 403 has at least one electrically conductive layer. It is noted that a circuit pattern can be preformed in the at least one electrically conductive layer. Alternatively, the circuit pattern could be formed in a later step, e.g. after the step of unfolding the inner substrate, which should also be considered to have the same meanings of "circuit substrates" of the present invention.

Step 3: the inner substrate 10 is folded in a manner such that at least two of the substrate units 11 are stacked one on another.

Figure 8:
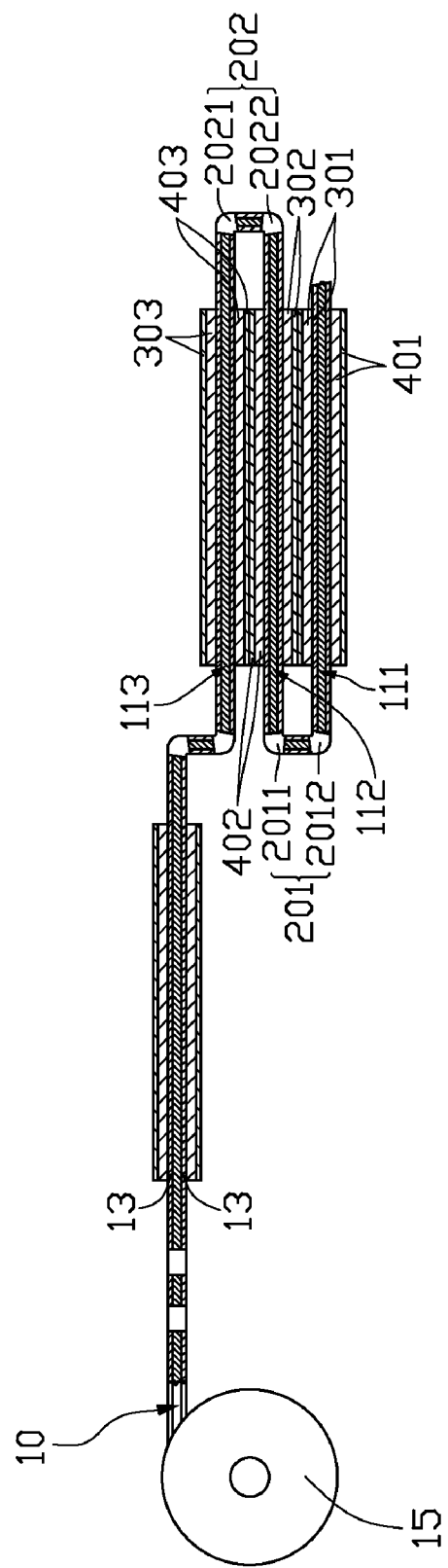
FIG. 8 is a schematic, cross-sectional view of folding of the substrate units of an inner substrate having circuit substrates laminated thereon according to the present embodiment.

In detail, in order to stack the second substrate unit 112 on the first substrate unit 111, a distance between the first line of the first through-holes 2011 and the second line of the second through-holes 2012 of the first folding portion 201 is equal to a total thickness of the inner substrate 10, the first circuit substrate 301 laminated onto the first substrate unit 111 and the third circuit substrate 302 laminated onto the second substrate unit 112. Referring FIG. 8, after laminating, the inner substrate 10 can be folded at the first folding portion 201, and thus the second substrate unit 112 is stacked on the first substrate unit 111. In such configuration, the third circuit substrate 302 laminated onto the second substrate unit 112 can contact with and disposed onto the first circuit substrate 301 laminated onto the first substrate unit 111. Thus, the first circuit substrate 301 and the third circuit substrate 302 are sandwiched between the first substrate unit 111 and the second substrate unit 112.

Similarly, in order to stack the third substrate unit 113 on the second substrate unit 112, a distance between the first line of the first through-holes 2021 and the second line of the second through-holes 2022 of the second folding portion 202 is equal to a total thickness of the inner substrate 10, the fourth circuit substrate 401 laminated onto the second substrate unit 112 and the sixth circuit substrate 403 laminated onto the third substrate unit 113. The inner substrate 10 can also be folded at the second folding portion 202, and thus the third substrate unit 113 is stacked on the second substrate unit 112. In such configuration, the sixth circuit substrate 403 laminated onto the third substrate unit 113 can be in contact with and disposed onto the fourth circuit substrate 402 laminated onto the second substrate unit 112. The fourth circuit substrate 401 and the sixth circuit substrate 403 are sandwiched between the second substrate unit 112 and the third substrate unit 113. Similarly, multiple substrate units 11 laminated with circuit substrates can be stacked one by one in the manner described above.

Additionally, because the circuit substrates are laminated onto the substrate units 11 using an adhesive, the surplus adhesive may overflow from the edges of the substrate units 11 and the circuit substrates during laminating. When the substrate units 11 are stacked one by one, the surplus adhesive may overflow and cause the substrate units 11 to adhere to each other. Thus, it is difficult for the substrate units 11 to be stacked or unstacked repeatedly. Advantageously, when one substrate unit 11 is stacked on another substrate unit 11, a separating film (not shown) can be interposed between the two neighboring stacked substrate units 11. For example, in the present embodiment, one separating film can be interposed between the third circuit substrate 302 laminated onto the second substrate unit 112 and the first circuit substrate 301 laminated onto the first substrate unit 111, and another separating film can be interposed between the sixth circuit substrate 403 laminated onto the third substrate unit 113 and the fourth circuit substrate 402 laminated onto the second substrate unit 112.

Step 4: the stacked substrate units 11 are unfolded.

Generally, a process for manufacturing multilayer printed circuit boards using the substrate units of the inner substrate 10 includes the step of drilling holes in the circuit substrates, forming electrical traces on the circuit substrates, electroplating gold on terminals of the electrical traces, laminating protective films on the circuit substrates, inspecting electrical connection and external appearance, and so on. Therefore, the stacked substrate units may need to be unfolded to undergo these steps.

It is understood that the inner substrate 10 stacked as described above can be unfolded at the first folding portion 201 and the second folding portion 202. Thus the third substrate unit 113 can unstacked from the second substrate unit 112, and the second substrate unit 112 can unstacked from the first substrate unit 111. Similarly, multiple substrate units 11 can be unstacked one by one. When one substrate unit 11 is unstacked from the other substrate units 11, sequential steps to form multilayer printed circuit boards, for example, forming outside electrical traces on the circuit substrates, electroplating gold on terminals of the electrical traces, and laminating protective films on the circuit substrates, can be performed.

Step 5: the at least one circuit substrate on each of the unfolded substrate units 11 is processed.

The sequential steps includes drilling holes in the circuit substrates, forming outside electrical traces on the circuit substrates, electroplating gold on terminals of the electrical traces, laminating protective films on the circuit substrates, inspecting electrical connection and external appearance, and so on. In these steps, referring to FIG. 9, multilayer printed circuit boards can be manufactured using the substrate units 11 of the inner substrate 10 in a manner such that the inner substrate 10 is unfolded at the folding portions 20. When one substrate unit 11 is unfolded from a stack of the substrate units 11, one of the steps of drilling holes in the circuit substrates, forming outside electrical traces on the circuit substrates, electroplating gold, laminating protective films on the circuit substrates, and inspecting electrical connection and external appearance, can be performed on the one unfolded substrate unit 11.

Figure 9:
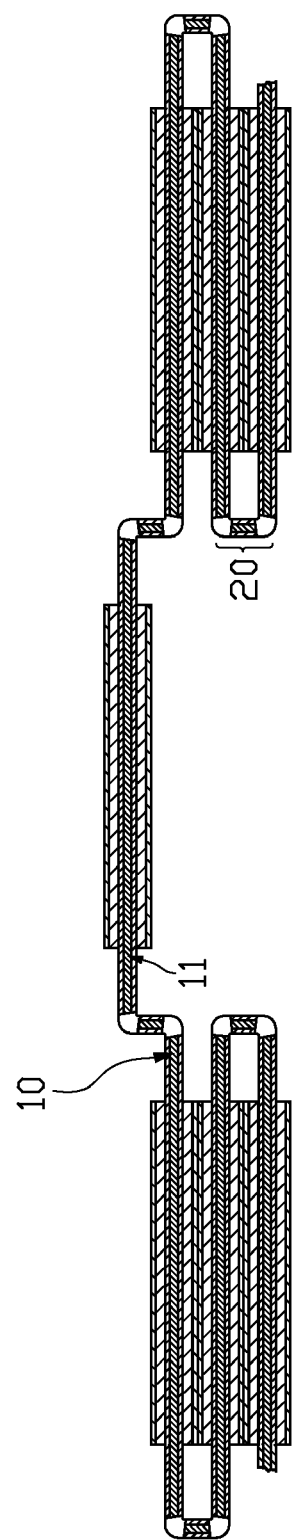
FIG. 9 is a schematic, cross-sectional view of unfolding and folding of the substrate units of an inner substrate having circuit substrates laminated thereon according to the present embodiment.

It is understood that, after one substrate unit 11 has undergone one of the steps of drilling holes in the circuit substrates, forming electrical traces on the circuit substrates, electroplating gold on terminals of the electrical traces, laminating protective films on the circuit substrates, and inspecting electrical connection and external appearance, the one unfolded substrate unit 11 can be stacked on the other substrate units 11 again. For example, as shown in FIG 9, the one unfolded substrate unit 11 can be stacked on the other substrate units 11 that have already undergone the same step. It is also understood that some steps can be performed on the stacked substrate units 11. For example a baking step can be performed after the substrate units 11 laminated with the circuit substrates are stacked together.

Figure 10:
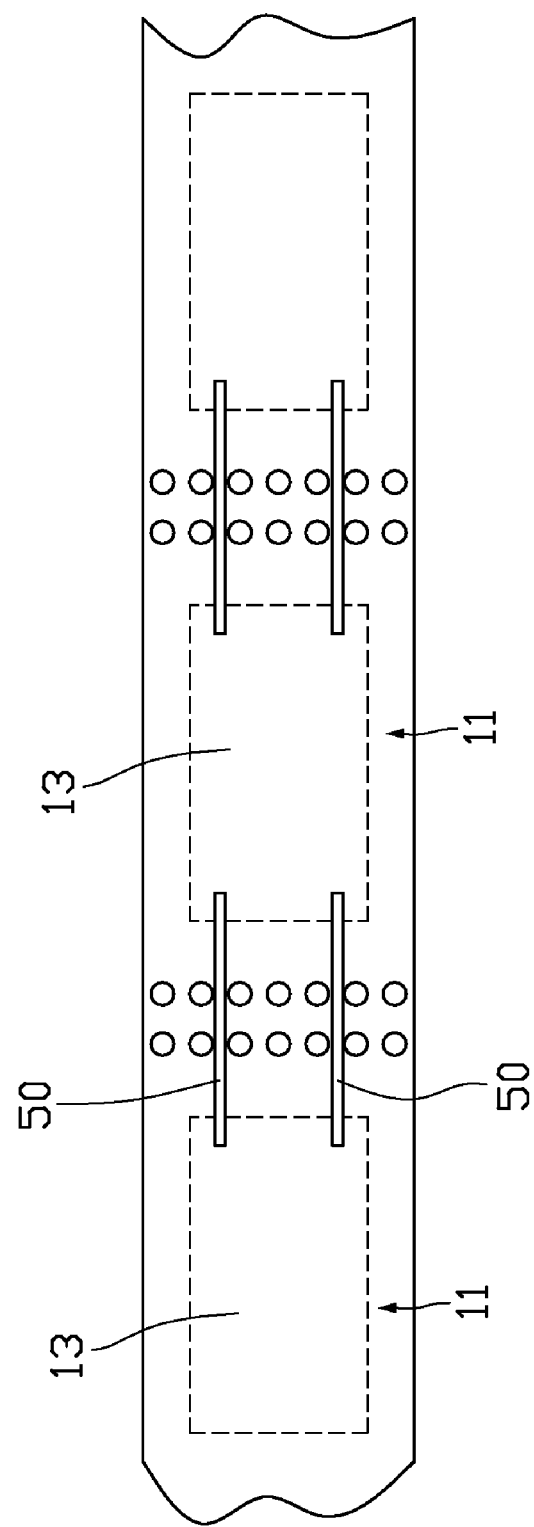
FIG. 10 is a schematic view of an inner substrate having conductive adhesive tapes attaching thereon.

Preferably, in the step of electroplating gold on terminals of the electrical traces, at least a conductive adhesive tape 50 can be attached on the inner substrate 10, as shown in FIG. 10. The conductive adhesive tape 50 is configured for connecting the two neighboring substrate units 11 so as to electrically connect the conductive circuit patterns formed with conductive circuit layers 13 of the two neighboring substrate units 11. The conductive adhesive tape 50 can be attached onto the conductive circuit layers 13 using a method such as a thermal attachment or an ultrasonic attachment.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A method for manufacturing multilayer printed circuit boards, comprising the steps of:
   providing an elongated inner substrate comprising a plurality of substrate units and a plurality of transverse folding portions alternately arranged along a longitudinal direction thereof, each of the folding portions being interconnected between two neighboring substrate units, each of the folding portions defining at least one line weakness perpendicular to the longitudinal direction of the inner substrate; and
   laminating at least one circuit substrate on each of the substrate units;
   folding the inner substrate in a manner such that at least two of the substrate units are stacked one on another;
   unfolding the stacked substrate units as needed to perform processing of the at least one circuit substrate on each of the unfolded substrate units; and
   processing the at least one circuit substrate on each of the unfolded substrate units.

2. The method as claimed in claim 1, wherein processing the at least one circuit substrate comprises at least one step selected from the group of steps consisting of drilling holes in the at least one circuit substrate, forming electrical traces on the at least one circuit substrate, electroplating gold on terminals of the electrical traces, laminating protective films on the at least one circuit substrate, and inspecting electrical connection and external appearance.

3. The method as claimed in claim 1, wherein a separating film is interposed between the two neighboring stacked substrate units.

4. The method as claimed in claim 1, wherein the at least one line weakness includes a first line and a second line, each of the folding portions comprising a plurality of first through-holes aligned in the first line and a plurality of second through-holes aligned in the second line parallel to the first line.

5. The method as claimed in claim 4, wherein a distance between a first line and the second line is either equal to or more than a total thickness of the inner substrate and the at least one circuit substrate sandwiched between two neighboring stacked substrate units of the inner substrate.

6. The method as claimed in claim 1, wherein each of the folding portions defines a groove in at least one side thereof along the at least one line weakness.

7. The method as claimed in claim 6, wherein a width of the groove is either equal to or more than a total thickness of the inner substrate and the at least one circuit substrate sandwiched between two neighboring stacked substrate units of the inner substrate.

8. The method as claimed in claim 1, wherein the at least one line weakness includes a first line and a second line, each of the folding portions comprising a first groove in at least one side thereof along in the first line and a second groove in at least one side thereof along the second line parallel to the first line.

9. The method as claimed in claim 8, wherein a distance between a first line and the second line is either equal to or more than a total thickness of the inner substrate and the at least one circuit substrate sandwiched between two neighboring stacked substrate units of the inner substrate.

10. The method as claimed in claim 2, wherein prior to electroplating gold on terminals of the electrical traces, at least one conductive adhesive tape is attached on the inner substrate to electrically connect two neighboring substrate units.

11. The method as claimed in claim 10, wherein the conductive adhesive tape is attached onto the inner substrate using a process selected from a group consisting of a thermal attachment process and an ultrasonic attachment process.

12. The method as claimed in claim 2, wherein the at least one line weakness includes a first line and a second line, each of the folding portions comprising a plurality of first through-holes aligned in the first line and a plurality of second through-holes aligned in the second line parallel to the first line.

13. The method as claimed in claim 12, wherein a distance between the first line and the second line is equal to or larger than a total thickness of the two neighboring substrate units of the inner substrate and the corresponding at least one circuit substrate or at least one circuit substrates which is or are sandwiched between the two neighboring substrate units when the two neighboring substrate units are stacked one on another.

14. The method as claimed in claim 2, wherein each of the folding portions defines a groove in at least one side thereof along the at least one line weakness.

15. The method as claimed in claim 14, wherein a width of the groove is equal to or larger than a total thickness of the two neighboring substrate units of the inner substrate and the corresponding at least one circuit substrate or at least one circuit substrates which is or are sandwiched between the two neighboring substrate units when the two neighboring substrate units are stacked one on another.

16. The method as claimed in claim 2, wherein the at least one line weakness includes a first line and a second line parallel to the first line, each of the folding portions comprising a first groove in at least one side thereof along the first line and a second groove in at least one side thereof along the second line.

17. The method as claimed in claim 16, wherein a distance between the first line and the second line is equal to or larger than a total thickness of the two neighboring substrate units of the inner substrate and the corresponding at least one circuit substrate or at least one circuit substrates which is or are sandwiched between the two neighboring substrate units when the two neighboring substrate units are stacked one on another.

18. The method as claimed in claim 2, wherein a separating film is interposed between each two neighboring stacked substrate units.

* * * * *